United States Patent
Ramaswamy et al.

(10) Patent No.: US 10,134,916 B2
(45) Date of Patent: Nov. 20, 2018

(54) TRANSISTOR DEVICES, MEMORY CELLS, AND ARRAYS OF MEMORY CELLS

(75) Inventors: D. V. Nirmal Ramaswamy, Boise, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 343 days.

(21) Appl. No.: 13/595,832

(22) Filed: Aug. 27, 2012

(65) Prior Publication Data

US 2014/0054709 A1    Feb. 27, 2014

(51) Int. Cl.
*H01L 29/78* (2006.01)
*H01L 27/088* (2006.01)
*H01L 29/788* (2006.01)
*H01L 27/11521* (2017.01)

(52) U.S. Cl.
CPC .... *H01L 29/7887* (2013.01); *H01L 27/11521* (2013.01)

(58) Field of Classification Search
CPC ......... H01L 29/42344; H01L 29/42328; H01L 29/66833; H01L 29/66484; H01L 29/78648; H01L 27/11563; H01L 27/1157; H01L 21/28282; H01L 29/792; H01L 29/4234; H01L 29/668332; H01L 45/06; H01L 45/145; H01L 27/2463; H01L 27/2481; G11C 13/0004; G11C 13/0007
USPC ......... 438/230; 257/344, E21.679, 314, 326; 365/185.1
See application file for complete search history.

(56) References Cited

U.S. PATENT DOCUMENTS

| | | | |
|---|---|---|---|
| 3,731,163 A * | 5/1973 | Shuskus | 257/324 |
| 6,531,371 B2 * | 3/2003 | Hsu | G11C 11/15 257/E27.004 |
| 6,534,326 B1 * | 3/2003 | Hsu | G11C 13/0007 257/E21.01 |
| 6,674,138 B1 * | 1/2004 | Halliyal et al. | 257/411 |
| 6,753,561 B1 | 6/2004 | Rinerson et al. | |
| 7,067,862 B2 | 6/2006 | Rinerson et al. | |
| 7,149,108 B2 | 12/2006 | Rinerson et al. | |
| 7,187,201 B1 | 3/2007 | Trimberger | |
| 7,727,897 B2 | 6/2010 | Ulrich et al. | |
| 7,821,809 B2 | 10/2010 | Yoo et al. | |

(Continued)

FOREIGN PATENT DOCUMENTS

WO    WO 2011/123465    10/2011

OTHER PUBLICATIONS

Theoretical investigation of native defects, impurities, and complexes in aluminum nitride; Stampfl et al; The American Physical Society; Physical Review B, vol. 65, pp. 155212-1-155212-10.

*Primary Examiner* — Matthew Reames
*Assistant Examiner* — John Bodnar
(74) *Attorney, Agent, or Firm* — Wells St. John P.S.

(57) ABSTRACT

A transistor device includes a pair of source/drain regions having a channel region there-between. A first gate is proximate the channel region. A gate dielectric is between the first gate and the channel region. A second gate is proximate the channel region. A programmable material is between the second gate and the channel region. The programmable material includes at least one of a) a multivalent metal oxide portion and an oxygen-containing dielectric portion, or b) a multivalent metal nitride portion and a nitrogen-containing dielectric portion. Memory cells and arrays of memory cells are disclosed.

24 Claims, 2 Drawing Sheets

(56) References Cited

U.S. PATENT DOCUMENTS

| | | | |
|---|---|---|---|
| 2001/0055838 A1* | 12/2001 | Walker | H01L 21/822 |
| | | | 438/129 |
| 2002/0137288 A1* | 9/2002 | Nomoto et al. | 438/261 |
| 2004/0000679 A1* | 1/2004 | Patel | H01L 27/088 |
| | | | 257/216 |
| 2004/0119122 A1* | 6/2004 | Ilkbahar | H01L 21/28282 |
| | | | 257/390 |
| 2004/0124466 A1* | 7/2004 | Walker et al. | 257/344 |
| 2005/0079675 A1* | 4/2005 | Ilkbahar | H01L 29/792 |
| | | | 438/261 |
| 2006/0171200 A1* | 8/2006 | Rinerson | G06F 17/5045 |
| | | | 365/185.1 |
| 2006/0261401 A1* | 11/2006 | Bhattacharyya | B82Y 10/00 |
| | | | 257/316 |
| 2007/0018219 A1 | 1/2007 | Lim et al. | |
| 2007/0029618 A1* | 2/2007 | Walker | H01L 27/115 |
| | | | 257/368 |
| 2007/0173019 A1 | 7/2007 | Ho et al. | |
| 2008/0083943 A1* | 4/2008 | Walker | 257/315 |
| 2008/0096396 A1* | 4/2008 | Shih | H01L 21/28282 |
| | | | 438/763 |
| 2009/0058704 A1* | 3/2009 | Abadeer | H03M 1/745 |
| | | | 341/144 |
| 2009/0225582 A1 | 9/2009 | Schloss | |
| 2010/0244120 A1* | 9/2010 | Kang et al. | 257/325 |
| 2011/0156020 A1 | 6/2011 | Jeon et al. | |
| 2011/0297927 A1 | 12/2011 | Ramaswamy et al. | |
| 2012/0098047 A1 | 4/2012 | Brewer et al. | |
| 2013/0062587 A1* | 3/2013 | Lee | H01L 45/08 |
| | | | 257/4 |
| 2013/0242637 A1* | 9/2013 | Yang | G11C 13/0002 |
| | | | 365/148 |

\* cited by examiner

TRANSISTOR DEVICES, MEMORY CELLS, AND ARRAYS OF MEMORY CELLS

TECHNICAL FIELD

Embodiments disclosed herein pertain to transistor devices, to memory cells, and to arrays of memory cells.

BACKGROUND

Integrated circuits may be formed on a semiconductor substrate such as a silicon wafer or other semiconducting material. In general, various materials which are semiconducting, conducting, and/or insulating are used to form the integrated circuits. By way of examples, the various materials can be doped, ion implanted, deposited, etched, grown, etc. using various processes. A continuing goal in semiconductor processing is to continue to reduce the size of individual electronic components thereby enabling smaller and denser integrated circuitry.

Memory is one type of integrated circuitry, and is used in computer and other electronic systems for storing or managing data. One type of circuitry component is the transistor. Memory may be fabricated in one or more arrays of individual memory cells which may include a transistor. Memory cells may be written to or read from using data/sense lines, for example a digit or bit line, and access lines (which may also be referred to as word lines). The digit lines may electrically interconnect memory cells along columns of an array, and the access lines may electrically interconnect memory cells along rows of an array. Each memory cell may be uniquely addressed through the combination of a data/sense line and an access line.

Memory cells may be volatile, semi-volatile, or non-volatile. Non-volatile memory cells can store data for extended periods of time, in many instances including when the computer is turned off. Volatile memory dissipates and therefore requires being refreshed/rewritten, in many instances multiple times per second. Regardless, memory cells are configured to retain or store information/data in at least two different selectable states. In a binary system, the states are considered as either a "0" or a "1". In other systems, at least some individual memory cells may be configured to store more than two levels or states of information.

DETAILED DESCRIPTION OF EXAMPLE EMBODIMENTS

Figure 1:
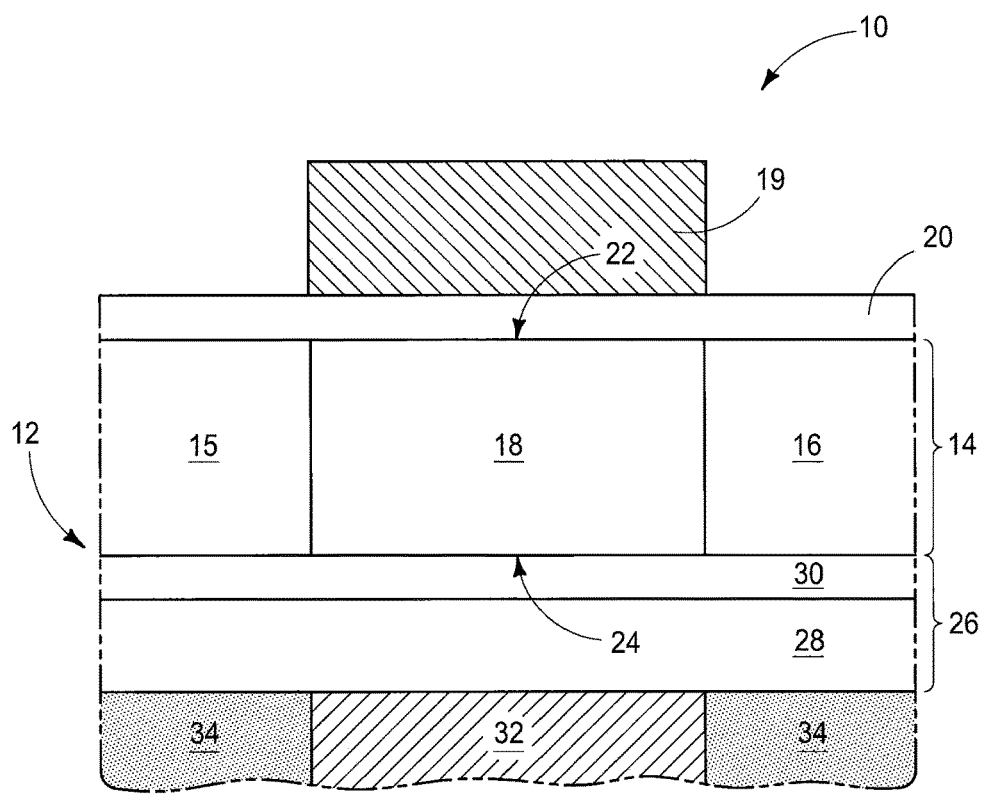
FIG. 1 is a diagrammatic sectional view of a transistor device in accordance with an embodiment of the invention, and of a memory cell in accordance with an embodiment of the invention.

An example transistor device 10 in accordance with an embodiment of the invention is shown and described with reference to FIG. 1. Transistor device 10 has been fabricated relative to a substrate 12 which may comprise a semiconductor substrate. In the context of this document, the term "semiconductor substrate" or "semiconductive substrate" is defined to mean any construction comprising semiconductive material, including, but not limited to, bulk semiconductive materials such as a semiconductor wafer. As examples, substrate 12 may comprise bulk monocrystalline semiconductive material (e.g., silicon) and/or a semiconductor-on-insulator substrate.

Substrate 12 comprises semiconductor material 14 which has been suitably doped with one or more impurities (e.g., conductivity-modifying impurities). Portions of semiconductor material 14 might be differently doped with the same or different type impurities (e.g., conductivity-modifying impurities) to provide one or more different current conductive operating characteristics based upon applied voltage. For example, semiconductor material 14 comprises a pair of source/drain regions 15, 16 and a channel region 18 therebetween. Suitable dopant types and concentrations may be selected by the artisan. As an example, source/drain regions 15, 16 may be doped n-type, with channel region 18 doped p-type. The dopant concentrations within each of regions 15, 16, and 18 may be homogenous or non-homogenous. Further regions 15, 16, and 18 may be homogenous or non-homogenous independent of consideration of homogeneity with respect to dopants. Halo and/or LDD regions (not shown) may additionally be provided. Example p-type dopant concentration for channel region 18 is about $1 \times 10^{18}$ ions/cm$^3$. Example n-type dopant concentration for source/drain regions 15, 16 is at least $5 \times 10^{19}$ ions/cm$^3$. The source/drain regions and channel regions may or may not encompass all of the thickness of semiconductor material 14, and semiconductor material 14 may or may not have planar elevationally innermost and outermost surfaces. For purposes of the continuing discussion, channel region 18 may be considered as having opposing or opposite sides 22, 24. An example thickness for semiconductor material 14 is from about 100 Angstroms to about 200 Angstroms. By way of examples only, semiconductor material may be fabricated using semiconductor-on-insulator techniques using handle and donor wafers, and/or by lateral epitaxial growth of semiconductor material such as silicon.

A first gate 19 is proximate channel region 18 and may comprise portion of an access line. A gate dielectric 20 is between first gate 19 and channel region 18. First gate 19 may be homogenous or non-homogenous, and may comprise one or more of conductively doped semiconductive material (e.g., conductively doped polysilicon), elemental metals, and/or conductive metal compounds (e.g., conductive metal silicides). First gate 19 may comprise charge storage regions (not shown), for example a floating gate region (not shown) and associated inter-dielectric (not shown). Gate dielectric 20 may be homogenous or non-homogenous, and comprises any suitable dielectric material. Gate dielectric 20 may be fabricated as shown or to have a lateral outline the same as that of first gate 19 (not shown). An example thickness for first gate 19 is from about 10 Angstroms to about 500 Angstroms, while that for gate dielectric 20 is from about 5 Angstroms to about 300 Angstroms.

A second gate 32 is also proximate channel region 18, with a programmable material 26 being between second gate 32 and channel region 18. Second gate 32 may be of the same or different composition and/or construction as first gate 19. The programmable material comprises at least one of a) a multivalent metal oxide portion and an oxygen-containing dielectric portion, or b) a multivalent metal nitride portion and a nitrogen-containing dielectric portion.

The programmable material may comprise both of "a" and "b" whether in series and/or in parallel between the second gate and the channel region. The programmable material may comprise additional materials to the "a" and/or "b" portions. Programmable material 26 is shown by way of example as comprising a single multivalent portion 28 (i.e., a multivalent metal oxide portion or a multivalent metal nitride portion) and a single dielectric portion 30 (i.e., an oxygen-containing dielectric portion or a nitrogen-containing dielectric portion).

An example thickness for second gate 32 is from about 10 Angstroms to about 500 Angstroms. An example thickness for multivalent portion 28 is from about 10 Angstroms to about 2,000 Angstroms. An example thickness for dielectric portion 30 is from about 30 Angstroms to about 40 Angstroms. One or both of multivalent portion 28 and dielectric portion 30 may be fabricated as shown or to have a lateral outline the same as that of second gate 32 (not shown). Dielectric material 34 (e.g., doped or undoped silicon dioxide and/or silicon nitride) is received laterally adjacent second gate 32.

In one embodiment and as shown, dielectric portion 30 is directly against channel region 18, multivalent portion 28 is directly against second gate 32, and/or multivalent portion 28 is directly against dielectric portion 30. In this document, a material or structure is "directly against" another when there is at least some physical touching contact of the stated materials or structures relative one another. In contrast, "over" encompasses "directly against" as well as construction where intervening material(s) or structure(s) result(s) in no physical touching contact of the stated materials or structures relative one another. FIG. 1 also shows an example embodiment wherein no portion of second gate 32 is directly against channel region 18, although some portion thereof may be so (not shown).

FIG. 1 shows an example embodiment wherein first gate 19 is proximate one of opposite sides 22, 24 (e.g., side 22) and second gate 32 is proximate the other of opposite sides 22, 24 (e.g., side 24). Alternate constructions may be used. For example, programmable material 26 and associated second gate 32 may contact channel region 18 on a side thereof which is not directly opposite the side over which gate dielectric 20 is received over channel region 18.

Figure 2:
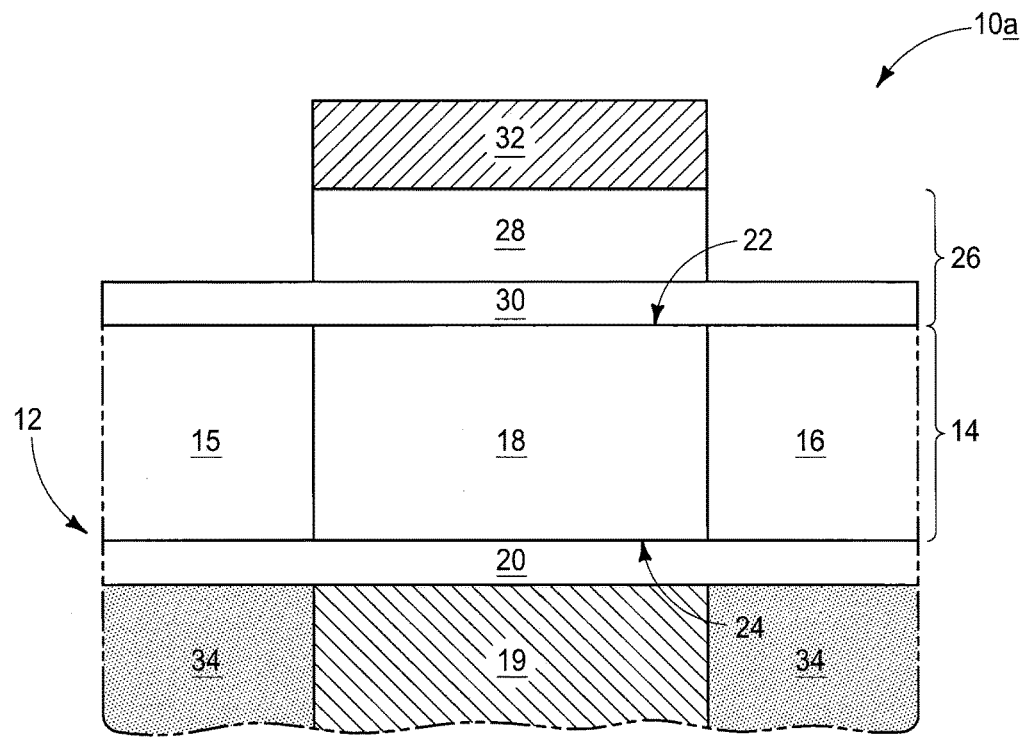
FIG. 2 is a diagrammatic sectional view of a transistor device in accordance with an embodiment of the invention, and of a memory cell in accordance with an embodiment of the invention.

Further, FIG. 1 shows an example horizontal structure, for example where channel region 18 is horizontally oriented, first gate 19 is above channel region 18, and second gate 32 is beneath channel region 18. However, other orientations may be used. For example, FIG. 2 shows an example transistor device 10a wherein these relationships are reversed. Like numerals from the above described embodiment have been used where appropriate. Alternately, vertical transistor devices may be used, for example where predominant current flow through channel region 18 is vertical as opposed to horizontal as it is in example devices 10 and 10a in FIGS. 1 and 2. In this document, vertical is a direction generally orthogonal to a primary surface relative to which the substrate is processed during fabrication and which may be considered to define a generally horizontal direction. Further, "vertical" and "horizontal" as used herein are generally perpendicular directions relative one another independent of orientation of the substrate in three dimensional space. Further, words such as "underlying", "under", "outward", "beneath", "above", and "elevationally" are relative terms corresponding to the vertical direction with respect to the structure being described.

In some embodiments, the metal of a multivalent metal oxide portion 28 comprises, consists essentially of, or consists of one or more of barium, ruthenium, strontium, titanium, calcium, manganese, praseodymium, lanthanum, and samarium. Specific examples include one or a combination of $Sr_xRu_yO_z$, $Ru_xO_y$, $In_xSn_yO_z$, MgO, $Ta_2O_5$, $SrTiO_3$, $SrZrO_3$, $BaTiO_3$, $Ba_{(1-x)}Sr_xTiO_3$, $ZrO_x$ (perhaps doped with La), and $CaMnO_3$ (doped with one or more of Pr, La, Sr, or Sm). In some embodiments, an oxygen-containing dielectric portion 30 comprises, consists essentially of, or consists of one or more of oxides of hafnium, titanium, zirconium, yttrium, and aluminum. In one embodiment, a multivalent metal oxide portion 28 consists essentially of praseodymium, calcium, manganese, and oxygen in at least one operational state. Programmable material 26 might comprise additional oxides or other materials not comprising oxide.

In some embodiments, the metal of a multivalent metal nitride portion 28 comprises, consists essentially of, or consists of one or more of aluminum and gallium. In some embodiments, a nitrogen-containing dielectric portion 30 comprises, consists essentially of, or consists of one or more of oxides of hafnium, titanium, zirconium, yttrium, and tantalum. In one embodiment, a multivalent metal nitride portion 28 consists essentially of at least one of aluminum and gallium, and nitrogen, in at least one operational state. Programmable material 26 might comprise additional nitrides or other materials not comprising nitride.

Example programmable materials are also described and disclosed in U.S. Pat. Nos. 6,753,561; 7,149,108; 7,067,862; and 7,187,201, as well as in U.S. Patent Application Publication Nos. 2006/0171200 and 2007/0173019.

In one embodiment, threshold voltage of the transistor device relative to operation of first gate 19 ($V_t$) may be changed by applying a first voltage having a first polarity across the first and second gates, and reversibly changed by applying a second voltage having a second polarity across the first and second gates where the second polarity is opposite to the first polarity. The structure, dimensions, and materials of portions 28, 30 may be selected to enable such $V_t$ to be so varied. For example, threshold voltage of the transistor device relative to operation of first gate 19 might be reversibly changed as determined by degree of charge retention within dielectric portion 30. Ideally in such and other embodiments, dielectric portion 30 is more proximate channel region 18 than is multivalent portion 28. Further ideally, multivalent portion 28 is more proximate second gate 32 than is dielectric portion 30.

In some embodiments, charge storage, for example in the form of oxygen ions, oxygen vacancies, and/or other species, in an oxygen-containing dielectric portion 30 impacts threshold voltage of channel region 18 relative to operation of first gate 19. In some embodiments, charge storage, for example in the form of nitrogen ions, nitrogen vacancies, and/or other species, in a nitrogen-containing dielectric portion 30 impacts threshold voltage of channel region 18 relative to operation of first gate 19. Variation in such charge storage may be used to modulate such $V_t$ in reversible and controllable manners which may enable device 10 to comprise a memory cell of memory circuitry, in one embodiment. Any of the other above stated attributes may apply in such a memory cell. As examples of operation, applying a positive potential (+V) to first gate 19 while applying ground or a negative potential (0V or −V) to second gate 32 may provide negative charge and/or negative species migration from multivalent portion 28 into dielectric portion 30 thereby increasing $V_t$ of the device from what it was before application of such potential(s). Conversely, applying a negative potential to first gate 19 while applying 0V or +V to second gate 32 may force such negative species and/or charge carriers back into multivalent portion 28 (and/or positive species/charges into dielectric portion 30) and thereby reduce $V_t$ of the device. Such may form a memory cell which is substantially non-volatile and which may have better charge retention than a two terminal memory cell having solely a multivalent portion and a dielectric portion there-between. Further and regardless, more than two memory program states (e.g., more than two $V_t$ states) may be used.

Figure 3:
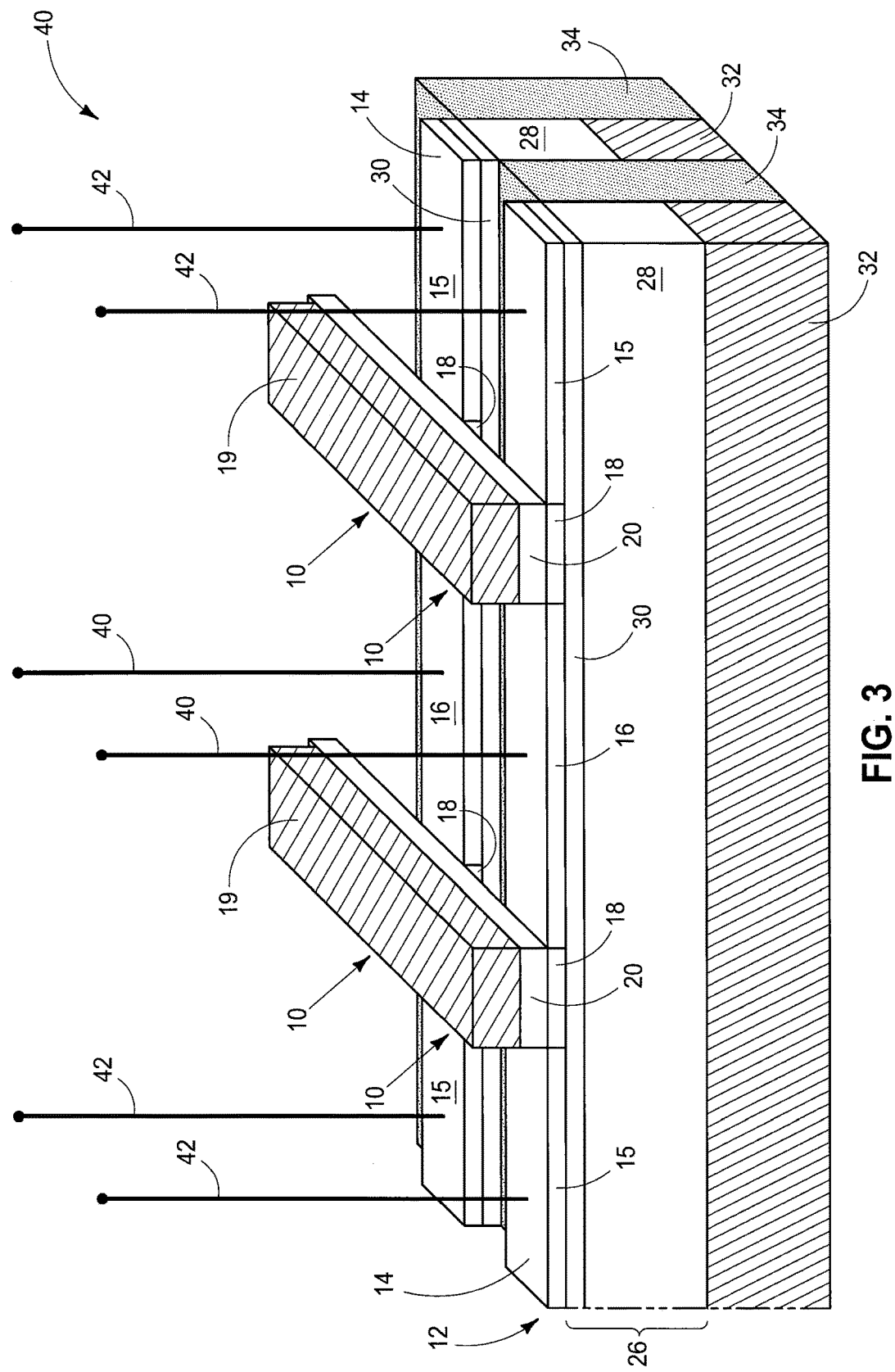
FIG. 3 is a diagrammatic hybrid schematic and isometric view of a portion of a memory array in accordance with an embodiment of the invention.

Embodiments of the invention also encompass arrays of memory cells, for example an array 40 as shown in FIG. 3. Like numerals from the above described embodiments have been used where appropriate. Array 40 includes a plurality of first gate lines 19 (e.g., access lines) over one side of respective channel regions 18. Only two such gate lines are shown for brevity and clarity, although many more will likely certainly be in the array. Gate dielectric 20 is between first gate lines 19 and the one side of channel regions 18. Channel regions 18 are between respective pairs of source/drain region regions 15, 16. Individual source/drain regions 16 may comprise a shared source/drain region for immediately laterally adjacent devices 10, as shown. Other constructions may be used. Immediately adjacent source/drain regions, or groups of multiple adjacent source/drain regions, may be isolated relative to one another (not shown). For example in the depicted embodiment, dielectric isolation (not shown) may be provided laterally outward of each source/drain region 15 within semiconductor material lines 14, and the 15/16/15 source/drain relationship repeated. Other constructions may be used.

A plurality of second gate lines 32 cross first gate lines 19 on a side of the respective channel regions 18 which is opposite the side over which first gate lines 19 are received. First gate lines 19 and second gate lines 32 are shown as being respectively linearly straight and parallel, although non-straight, non-parallel, angled, curvilinear, multi-segmented combinations of these and other configurations may be used. Further, first gate lines 19 and second gate lines 32 are shown crossing one another orthogonally, although other angles may be used.

Programmable material 26 is between second gate lines 32 and channel regions 18, and comprises a multivalent portion 28 and a dielectric portion 30. Any of the attributes and materials as described above may be used. One, both, or neither of the multivalent portions 28 and/or dielectric portions 30 may be formed in a plurality of lines which are respectively parallel with respect to the second lines. Further, if so formed, such lines may have longitudinal outlines which are the same as those of the second lines. FIG. 3 shows an example embodiment wherein each of multivalent portions 28 and dielectric portions 30 is formed in a plurality of lines, and which also have longitudinal outlines which are the same as those of second gate lines 32. Further, the memory cell structure largely of FIG. 1 is shown in FIG. 3, although that of FIG. 2 and/or vertical and other structure and orientation may be used.

Shared source/drain regions 16 may connect with a data/sense line, for example as is schematically shown by conductive interconnects 40. The depicted interconnects 40 would connect with different data/sense lines (not shown) which may, for example, run generally orthogonally relative to first gate lines 19. Individual conductive interconnects 42 are schematically shown electrically coupling with source/drain regions 15. Interconnects 42 may connect to one another in one or more lines (not shown), or may be isolated from one another, for providing source/drain regions 15 at one or more suitable potentials during read, write, and erase operations.

As an example technique of programming individual memory cells of the above array, programming into one state may be conducted by applying $-\frac{1}{2}V$ to one selected second gate line 32 and $+\frac{1}{2}V$ to one selected first gate line 19 of a selected memory cell where such selected lines 32 and 19 cross. Second gate lines 32 that are immediately adjacent the selected gate lines may be provided at zero potential, whereby the two unselected memory cells that are immediately adjacent the selected memory cell along the selected first gate line will only see $\frac{1}{2}V$, and thereby not be programmed. The other second gate lines 32 may be provided at $-\frac{1}{2}V$, whereby all other unselected memory cells will see 0V. Programming may be reversed (erased) by reversing these polarity relationships. Reading of a memory cell state may occur by using one or the other of the programming/erase relationships using some potential which is less than $\frac{1}{2}V$, for example $+\frac{1}{4}V$ or $-\frac{1}{4}V$. Numerous other programming and reading techniques may be used, and may depend on the construction of the array as will be appreciated by the artisan.

CONCLUSION

In some embodiments, a transistor device comprises a pair of source/drain regions having a channel region there-between. A first gate is proximate the channel region. A gate dielectric is between the first gate and the channel region. A second gate is proximate the channel region. A programmable material is between the second gate and the channel region. The programmable material comprises at least one of a) a multivalent metal oxide portion and an oxygen-containing dielectric portion, or b) a multivalent metal nitride portion and a nitrogen-containing dielectric portion.

In some embodiments, a memory cell comprises a pair of source/drain regions having a channel region there-between. A first gate is proximate the channel region. A gate dielectric is between the first gate and the channel region. A second gate is proximate the channel region. A programmable material is between the second gate and the channel region. The programmable material comprises at least one of a) a multivalent metal oxide portion and an oxygen-containing dielectric portion, or b) a multivalent metal nitride portion and a nitrogen-containing dielectric portion.

In some embodiments, an array of memory cells comprises a plurality of first gate lines over one side of respective channel regions. Gate dielectric is between the first gate lines and the one side of the channel regions. The channel regions are between respective pairs of source/drain regions. A plurality of second gate lines cross the first gate lines on a side of the respective channel regions opposite the one side. Programmable material is between the second gate lines and the channel regions. The programmable material comprises at least one of a) a multivalent metal oxide portion and an oxygen-containing dielectric portion, or b) a multivalent metal nitride portion and a nitrogen-containing dielectric portion.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor device comprising: a pair of source/drain regions having a channel region there-between;
   a first gate on a first side of the channel region, the first gate being patterned into a first gate line extending along a first direction; a gate dielectric between the first gate and the channel region;
   a second gate on an opposing second side of the channel region, the second gate being patterned into a second gate line extending along a second direction that crosses the first direction; a layer of programmable material that extends continuously in the second direction along the entire length of the second gate, and between the second gate and the channel region, the programmable material comprising at least one of
   a) a multivalent metal oxide portion comprising one or more of $Sr_xRu_yO_z$, $RuO_x$, $In_xSn_yO_z$, MgO, $BaTiO_3$, $ZrO_x$ and $CaMnO_3$ doped with La, Sr or Sm, and an oxygen-containing dielectric portion, or
   b) a multivalent metal nitride portion and a nitrogen-containing dielectric portion; and wherein the multivalent portion of the programmable material is directly against the second gate.

2. The transistor device of claim 1 wherein the dielectric portion of the programmable material is more proximate the channel region than is the multivalent metal oxide portion, and wherein threshold voltage of the transistor device relative to operation of the first gate may be changed by applying a first voltage having a first polarity across the first and second gates and reversibly changed by applying a second voltage having a second polarity across the first and second gates, the second polarity being opposite to the first polarity.

3. The transistor device of claim 1 wherein the dielectric portion of the programmable material is directly against the channel region.

4. The transistor device of claim 1 wherein the multivalent portion of the programmable material is directly against the dielectric portion of the programmable material.

5. The transistor device of claim 1 wherein the channel region has opposite sides, the first gate being proximate one of the opposite sides and the second gate being proximate the other of the opposite sides.

6. The transistor device of claim 1 wherein no portion of the second gate is directly against the channel region.

7. The transistor device of claim 1 wherein the programmable material comprises the multivalent metal oxide portion and the oxygen-containing dielectric portion.

8. The transistor device of claim 7 wherein the multivalent metal oxide portion comprises one or more of barium, ruthenium, strontium, titanium, calcium, manganese, praseodymium, lanthanum and samarium.

9. The transistor device of claim 7 wherein the oxygen-containing dielectric portion comprises one or more oxides of hafnium, zirconium, yttrium, and aluminum.

10. The transistor device of claim 7 wherein the multivalent metal oxide portion comprises one or more of barium, ruthenium, strontium, titanium, calcium, manganese, praseodymium, lanthanum and samarium; and the oxygen-containing dielectric portion comprises one or more oxides of hafnium, zirconium, yttrium, and aluminum.

11. The transistor device of claim 7 wherein the multivalent metal oxide portion comprises calcium, manganese, and oxygen; and the oxygen-containing dielectric portion comprises one or more oxides of hafnium, zirconium, yttrium, and aluminum.

12. The transistor device of claim 11 wherein the oxygen-containing dielectric portion consists essentially of one or more of oxides of hafnium, zirconium, yttrium, and aluminum.

13. The transistor device of claim 1 wherein the programmable material comprises the multivalent metal nitride portion and the nitrogen-containing dielectric portion.

14. The transistor device of claim 13 wherein the multivalent metal nitride portion comprises at least one of aluminum and gallium.

15. The transistor device of claim 13 wherein the nitrogen-containing dielectric portion comprises one or more nitrides of hafnium, titanium, zirconium, yttrium, and tantalum.

16. The transistor device of claim 13 wherein the multivalent metal nitride portion comprises at least one of aluminum and gallium, and the nitrogen-containing dielectric portion comprises one or more nitrides of hafnium, titanium, zirconium, yttrium, and tantalum.

17. A memory cell comprising:
   a pair of source/drain regions having a channel region there-between;
   a first gate on a first side of the channel region, the first gate being comprised by a first gate line that extends along a first direction;
   a gate dielectric between the first gate and the channel region;
   a second gate on an opposing second side of the channel region, the second gate being comprised by a second line that extends along a second direction that orthogonally crosses the first direction; and
   a layer of programmable material that extends continuously in the second direction along the entire length of the second gate, and between the second gate and the channel region, the line of programmable material extending along the second direction and comprising a multivalent metal nitride portion and a nitrogen-containing dielectric portion, the multivalent metal nitride portion being in direct physical contact with the second gate.

18. The memory cell of claim 17 wherein the dielectric portion of the programmable material is more proximate the channel region than is the multivalent metal nitride portion, and wherein threshold voltage of a transistor constituting the pair of source/drain regions, the channel region, the first gate, and the gate dielectric may be changed by applying a first voltage having a first polarity across the first and second gates and reversibly changed by applying a second voltage having a second polarity across the first and second gates, the second polarity being opposite to the first polarity.

19. An array of memory cells, comprising:
   a plurality of first gate lines over one side of respective channel regions, gate dielectric being between the first gate lines and the one side of the channel regions and being directly against the first gate lines, the channel regions being between respective pairs of source/drain regions;
   a plurality of second gate lines crossing the first gate lines on a side of the respective channel regions opposite the one side, programmable material between the second gate lines and the channel regions, the programmable material comprising at least one of
   a) a multivalent metal oxide portion comprising one or more of $Sr_xRu_yO_z$, $RuO_x$, $In_xSn_yO_z$, MgO, $BaTiO_3$, ZrOx and CaMnO3 doped with La, Sr or Sm, and an oxygen-containing dielectric portion, or b) a multivalent metal nitride portion and a nitrogen-containing dielectric portion; and wherein the multivalent metal portion of the programmable material is directly against the second gate lines and is patterned into lines of multivalent metal material that extend continuously along the entire length of the second gate lines.

20. The array of claim 19 wherein the lines of the multivalent material have lateral outlines which are the same as those of the second gate lines in one cross-section.

21. The array of claim 19 wherein the dielectric portions of the programmable material are formed in a plurality of lines which respectively parallel respective of the second gate lines.

22. The array of claim 21 wherein the lines of the dielectric portions have lateral outlines which are the same as those of the second gate lines in one cross-section.

23. The array of claim 19 wherein the multivalent portions of the programmable material and the dielectric portions of the programmable material are formed in a plurality of lines which respectively parallel respective of the second gate lines.

24. The array of claim 23 wherein the lines of the multivalent portions and the lines of the dielectric portions have lateral outlines which are the same as those of the second gate lines in one cross-section.

\* \* \* \* \*

UNITED STATES PATENT AND TRADEMARK OFFICE
CERTIFICATE OF CORRECTION

PATENT NO. : 10,134,916 B2
APPLICATION NO. : 13/595832
DATED : November 20, 2018
INVENTOR(S) : D. V. Nirmal Ramaswamy and Gurtej S. Sandhu It is certified that error appears in the above-identified patent and that said Letters Patent is hereby corrected as shown below:

Column 7, Lines 21-22 – Replace "SrxRuyOz, RuOx, InxSnyOz, MgO, BaTiO3, ZrOx and CaMnO3" with --$Sr_xRu_yO_z$, $RuO_x$, $In_xSn_yO_z$, $MgO$, $BaTiO_3$, $ZrO_x$ and $CaMnO_3$--

Columns 8-9, Lines 67-1 – Replace "SRxRuyOz, $RuO_x$, InxSnyOz, MgO, BaTiO3, ZrOx and CaMnO3" with --$Sr_xRu_yO_z$, $RuO_x$, $In_xSn_yO_z$, $MgO$, $BaTiO_3$, $ZrO_x$ and $CaMnO_3$--

Signed and Sealed this
Eighteenth Day of June, 2019

Andrei Iancu
*Director of the United States Patent and Trademark Office*